United States Patent [19]

Kolwicz et al.

[11] Patent Number: 4,627,032

[45] Date of Patent: Dec. 2, 1986

[54] GLITCH LOCKOUT CIRCUIT FOR MEMORY ARRAY

[75] Inventors: Kevin D. Kolwicz; Gilbert L. Mowery, Jr., both of Allentown, Pa.

[73] Assignee: AT&T Bell Laboratories, Murray Hill, N.J.

[21] Appl. No.: 554,914

[22] Filed: Nov. 25, 1983

[51] Int. Cl.$^4$ .............................................. G11C 7/00
[52] U.S. Cl. ................................... 365/203; 365/210; 365/233
[58] Field of Search ...................... 365/210, 233, 203

[56] References Cited

U.S. PATENT DOCUMENTS

| | | | |
|---|---|---|---|
| 3,778,784 | 12/1973 | Karp et al. | 365/233 |
| 3,962,686 | 6/1976 | Matsue et al. | 365/233 |
| 4,044,341 | 8/1977 | Stewart et al. | 365/203 |
| 4,072,932 | 2/1978 | Kitagawa et al. | 365/233 |
| 4,314,360 | 2/1982 | Higuchi et al. | 365/203 |
| 4,327,426 | 4/1982 | McAdams | 365/203 |
| 4,339,766 | 7/1982 | Rao | 397/41 |
| 4,363,111 | 12/1982 | Heightley | 365/210 |
| 4,373,195 | 2/1983 | Toyoda et al. | 365/154 |
| 4,417,328 | 11/1983 | Ochii | 365/203 |
| 4,500,974 | 2/1985 | Nagami | 365/210 |

OTHER PUBLICATIONS

Stofka, "Flip–Flops Deglitch PROM Output", EDN, vol. 27, No. 7, Mar. 31, 1982, p. 166.

Primary Examiner—James W. Moffitt
Assistant Examiner—Glenn A. Gossage
Attorney, Agent, or Firm—Wendy W. Koba

[57] ABSTRACT

The present invention relates to a glitch lockout circuit for a static random access memory (RAM) which prevents the writing or reading of incorrect data when a system clock is switched from a standard clock source to an alternate clock source. A dummy bit line is added to the memory arrangement which is always precharged during a first clock phase and discharged during a second clock phase. The state of the dummy bit line is latched with the first clock phase and is fed back to the clock generator to control the initiation of the second clock phase. Thus, if the dummy bit line stays low, the second clock phase will stay low and none of the RAM cells will be accessed.

3 Claims, 2 Drawing Figures

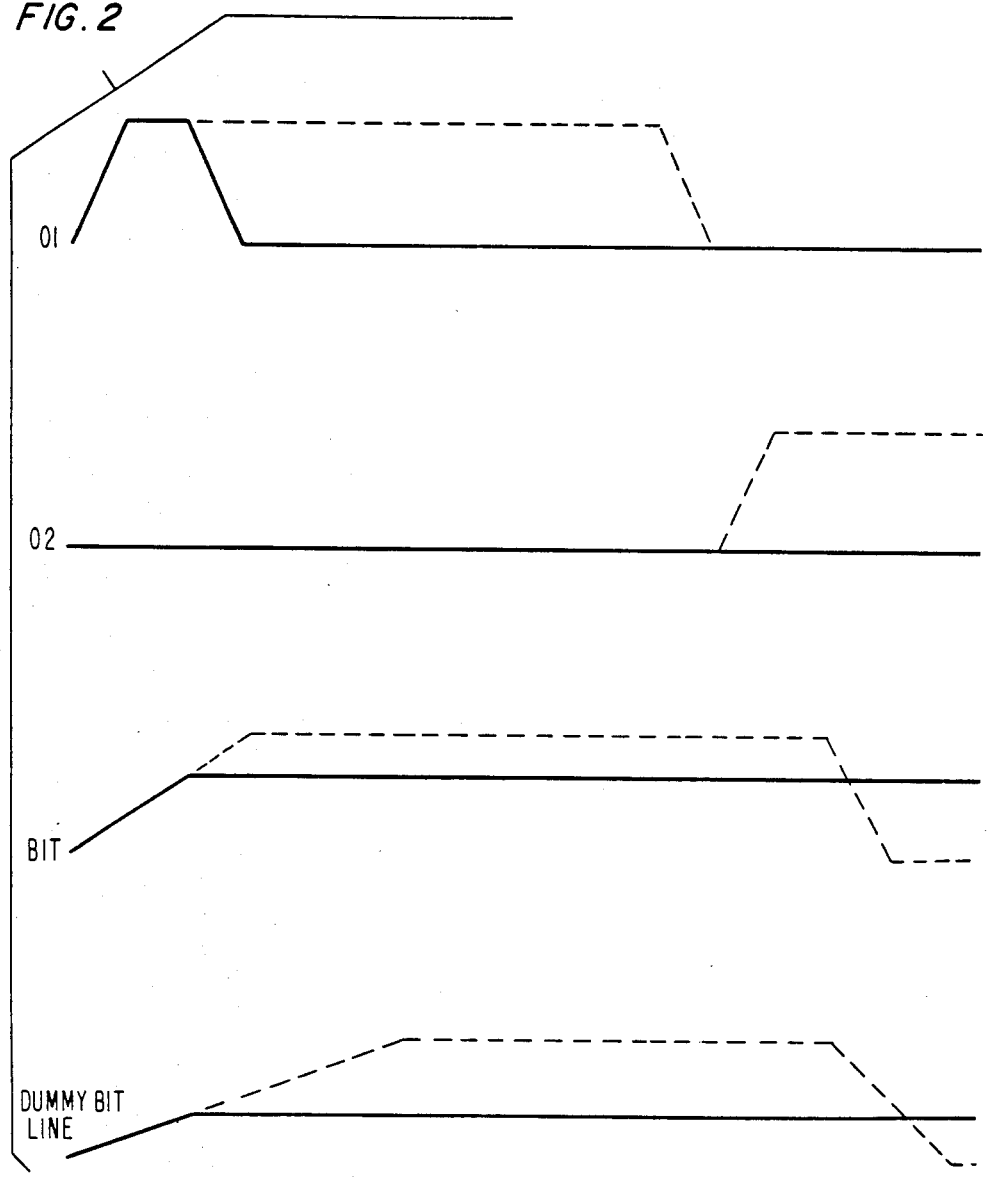

GLITCH LOCKOUT CIRCUIT FOR MEMORY ARRAY

BACKGROUND OF THE INVENTION

1. Field of the Invention

The present invention relates to a glitch lockout circuit for memory devices, and more particularly, to an arrangement wherein a dummy bit line is added to the memory arrangement which is always precharged during a first clock phase and discharged during a second clock phase. The state of the dummy line is latched with the first clock phase and is fed back to the clock generator to control the initiation of the second clock phase.

2. Description of the Prior Art

A variety of methods exists in the prior art for controlling the action of memory clock sources. One particular method is disclosed in U.S. Pat. No. 3,778,784 issued to J. A. Karp on Dec. 11, 1973, where the various clocking signals are generated from one master clock signal, the generation means being located on the memory chip itself to compensate for variations in external conditions which could affect the memory performance.

Another method of generating internal timing signals is disclosed in U.S. Pat. No. 3,962,686 issued to S. Matsue et al on June 8, 1976. In the Matsue et al arrangement an internal clocking means is provided which includes a first circuit for generating a signal upon the completion of one of the circuit functions involved in the operation of the memory circuit. That signal is applied to a second circuit which thereupon produces a timing signal that is used to control a second circuit function of the memory circuit.

U.S. Pat. No. 4,072,932 issued to N. Kitigawa et al on Feb. 7, 1978, also discusses the use of an internal clock source. Here, however, the internal clock is used to increase the read time of memory devices by sensing the completion of the precharging process, utilizing a bistable amplifier coupled to a differential voltage sensing transistor, where the bistable amplifier is activated at the start of the precharging process, and the transistor senses when the amplifier has stabilized and produces an output signal to indicate that stabilization has occurred.

Arrangements also exist in the prior art which utilize a dummy bit line for a variety of purposes. In U.S. Pat. No. 4,339,766 issued to G. R. Mohan Rao on July 13, 1982, a pair of dummy bit columns are used to prevent pattern sensitivity in testing. The dummy columns have capacitors which alternate between relatively large and small values so that a given cell will always read a "1" or "0" upon refresh. A dummy cell arrangement for sensing the logic state of an accessed memory cell in an MOS memory is disclosed in U.S. Pat. No. 4,363,111 issued to J. D. Heightley et al on Dec. 7, 1982. Here, a plurality of dummy cells are included in the cell array, each of which has a dummy capacitor of substantially the same given size as a memory cell capacitor. U.S. Pat. No. 4,044,341 issued to R. G. Stewart et al on Aug. 23, 1977, discloses a memory cell arrangement which includes a dummy row which is always charged to a first level prior to each read-out cycle, and discharged to a second level each time the contents of the array are read out. Means are included which sense the charge level on the dummy conductors to terminate the charging cycle when the charge level on the dummy conductors reaches the first level, thus accelerating the access time.

It is not uncommon for a system to have as a requirement the capacity to switch to another clock source if for one reason or another the clock signal in use is lost. This alternative clock typically is of a different phase and thus the possibility exists for a custom NMOS chip to receive a very narrow clock pulse, or glitch, on its clock input for one period. A chip consisting entirely of random or combinatorial logic can usually be designed to recover fairly quickly from this clock glitch, for example, by the use of a synchronization signal, but the problem is more serious if the chip contains random access memory (RAM). Therefore, it is desirable to lock out glitches that would incompletely precharge the bit lines.

SUMMARY OF THE INVENTION

The present invention relates to a glitch lockout circuit for memory devices, and more particularly, to an arrangement wherein a dummy bit line is added to the memory arrangement which is always precharged during the first clock phase and discharged during the second clock phase. The state of the dummy line is latched with the first clock phase and is fed back to the clock generator to control the initiation of the second clock phase.

It is an aspect of the present invention to provide an arrangement to lock out incomplete precharge cycles on, for example, a RAM by the addition of a minimal amount of additional on-chip circuitry.

A further aspect of the present invention is to provide a dummy line that most accurately represents an actual bit line, that is, a bit line which is geometrically very similar to an actual bit line so that its capacitance tracks as closely as possible with the real bit lines.

Yet another aspect of the present invention is to provide a dummy bit line which charges up slower than the real bit lines in order to assure that all of the real bit lines are completely precharged before attempting a valid read or write of the memory cells.

Other and further aspects of the present invention will become apparent during the course of the following description and by reference to the accompanying drawings.

BRIEF DESCRIPTION OF THE DRAWINGS

Referring now to the drawings, where like numerals represent like parts in several views:

FIG. 2 contains a timing diagram related to the configuration of FIG. 1 illustrating the operation of the present invention.

DETAILED DESCRIPTION

Figure 1:
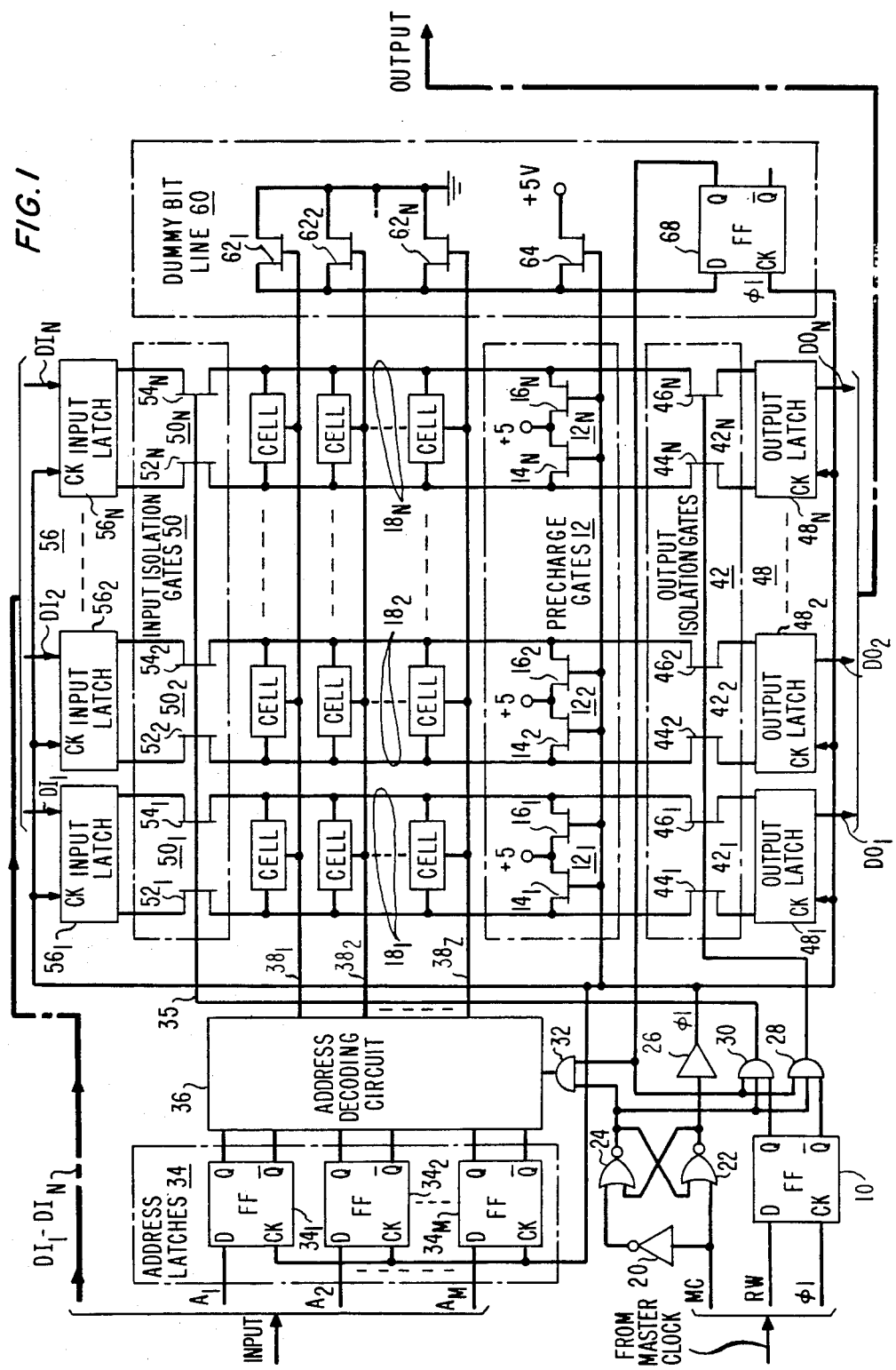
FIG. 1. illustrates an exemplary custom NMOS RAM configuration including the glitch lockout circuitry associated with the present invention.

A random access memory (RAM) in an NMOS polycell design typically uses a two-phase clock operation during which when clock phase $\phi 1$ is high, input, output, and address latches are enabled and the bit lines are precharged; when clock phase $\phi 2$ is high all input and output latches are closed, an addressed row of RAM cells are accessed, and valid data is established on the bit lines, either by reading or writing the RAM. If insufficient time is allowed for precharge, the bit lines will be brought to an unknown state, and the subsequent accessing of a row of RAM cells would allow this unknown state on the bit lines to be stored in the cells, changing the stored data. If the RAM is storing time slot information, for example, the effect to a customer will be disastrous.

Therefore, it is desirable to lock out glitches that would incompletely precharge the bit lines. An arrangement capable of accomplishing the lockout in accordance with the present invention is illustrated in FIG. 1. It is to be understood that the configuration of FIG. 1 is exemplary only, and is not intended to limit the scope of the present invention, since the lockout circuit of the present invention may be utilized with either static or dynamic RAM devices, and is not necessarily limited to the illustrated dual bit line, cross-coupled cell configuration.

Before discussing the operation of the lockout circuit of the present invention, the sequence of operations related to a typical RAM will be briefly discussed to facilitate the understanding of the present invention. At the initiation of the RAM operation, the first clock phase $\phi1$ is generated by a master clock MC (not shown), passes through a NOR gate 22 and appears at the output of a noninverting amplifier 26. First clock phase $\phi1$ travels along the output path from noninverting amplifier 26 and is subsequently applied as the gate input to a plurality of precharge gates $12_1$-$12_N$, where N is defined as the size of the cell array structure of the RAM.

As can be seen by reference to FIG. 1, each precharge gate $12_i$ comprises a pair of transistors $14_i$ and $16_i$, where the source inputs of each transistor are coupled together and connected to the positive power supply of the device, usually being 5 volts. The clock phase $\phi1$ is applied to the gate terminal of each transistor $14_1$-$14_N$, $16_1$-$16_N$, and the drain terminals of each transistor forming its associated precharge gate are coupled to the bit lines associated therewith. That is, the drain terminals of transistors $14_1$ and $16_1$ are coupled to bit line $18_1$, the drain terminals of transistors $14_2$ and $16_2$ are coupled to bit line $18_2$, and so on, with the drain terminals of transistors $14_N$ and $16_N$ coupled to bit line $18_N$. When clock phase $\phi1$ is applied as the gate input to transistors $14_1$-$14_N$ and $16_1$-$16_N$, precharge gates $12_1$-$12_N$ are activated, allowing the 5 volts appearing at the source inputs to pass through the devices to the drain terminals, thereby precharging bit lines $18_1$-$18_N$.

To avoid overlapping clock phase $\phi1$ and clock phase $\phi2$, clock phase $\phi2$ is generated from master clock MC, and an RW signal, as illustrated in FIG. 1. As shown, a signal is sent from MC and is applied to an inverter 20 and a pair of cross-coupled NOR gates 22 and 24. When a read or write signal is present at the D input of flip-flop 10, it will pass through filp-flop 10 and appear at the output thereof, where a read input signal (R) will cause the $\overline{Q}$ output to go high and a write input signal (W) will cause the Q output to go high. The $\overline{Q}$ output of flip-flop 10 is applied as a first input to an AND gate 28, where a second input to AND gate 28 is the output of NOR gate 24. Similarly, the Q output of flip-flop 10 is applied as a first input to an AND gate 30, where the output of NOR gate 24 is also applied as an input thereto. Therefore, either one of the read or write operations will not be initiated until the correct signal from MC has passed through cross-coupled NOR gates 22 and 24. The additional inputs to AND gates 28 and 30, as well as the operation of AND gate 32 will be discussed hereinafter in association with the operation of the present invention.

In order for the correct memory cell to be accessed, the address of the desired cell must be communicated to the memory array. This is accomplished, as shown in FIG. 1, using a plurality of address latches $34_1$-$34_M$, where M is equal to the entire number of cells in the array, and an address decoding circuit 36. Each of the address latches is responsive to a separate address signal $A_1$-$A_M$, where each address signal is associated in a one-to-one relationship with the memory cells. The address decoding circuit functions to determine which one or ones of the cells are to be activated by determining the presence of the address signals $A_1$-$A_M$. This information is passed along as the output of address decoding circuit 36, and is applied to the correct word-line $38_1$-$38_2$.

As described hereinabove, if the information from a particular cell is to be read out, AND gate 28 will be enabled, passing a read control signal to a plurality of output isolation gates $42_1$-$42_N$, where each isolation gate is associated with a separate bit line of the array. As shown in FIG. 1, each isolation gate $42_i$ comprises a pair of transistors $44_i$ and $46_i$, where the read enable output signal of AND gate 28 is applied to the gate input of each transistor $44_1$-$44_N$ and $46_1$-$46_N$. The source inputs of an exemplary pair of transistors $44_i$ and $46_i$ are connected, as shown in FIG. 1, to the opposite sides of its associated bit line $18_i$. Therefore, if the read enable signal is present at the gate input of a pair of transistors $44_i$ and $46_i$, output isolation gate $42_i$ is activated, and the charge appearing along the associated bit line $18_i$, resulting from the addressing of one of the cells along bit line $18_i$, will be passed through output isolation gate $42_i$. The output from isolation gate $42_i$ is subsequently passed through an associated output latch $48_i$, where a plurality of output latches $48_1$-$48_N$ are associated in a one-to-one relationship with the plurality of isolation gates $42_1$-$42_N$. Therefore, as seen by reference to FIG. 1, the output of output latch $48_i$ is the desired data bit $DO_I$ from the addressed memory cell along bit line $18_i$.

In a similar manner to the above-described read process, data may be transferred to and stored in any of the memory cells forming the cell array. In this case, a write input signal applied to the D input of flip-flop 10 will toggle the Q output of flip-flop 10, and enable AND gate 30. The write enable signal is passed along to a plurality of input isolation gates $50_1$-$50_N$, where each input isolation gate is associated with a separate bit line of the array. Each input isolation gate, as shown in FIG. 1, comprises a pair of transistors $52_i$ and $54_i$, the write enable signal being applied to the gate of each transistor. The source inputs of each transistor are connected to opposite sides of the associated bit line $18_i$, and the drain inputs are coupled to the input of an associated input latch $56_i$. The memory cell location which is to contain the information to be written is addressed in the same manner as that described in association with the read operation, using the same address latches $34_1$-$34_M$ and address decoding circuit 36. Therefore, if the write enable signal is present at the gate input of transistors $52_i$ and $54_i$, input isolation gate $50_i$ will be activated, connecting the bit line containing the cell desired to be written with its associated input latch $56_i$. The input data bit, denoted $DI_i$, is applied as an input to the associated input latch $56_i$ and when the correct clock signal is present, will be transferred through input latch $56_i$, and pass along bit line $18_i$ and stored in the desired cell of the array.

In accordance with the present invention, glitches, or incomplete precharges, are locked out by the addition of a dummy bit line 60, as illustrated n FIG. 1. Dummy bit line 60 comprises a plurality of N transistors $62_1$–$62_N$, disposed directly adjacent to the last column of the cell memory array. A precharged gate 64 is also included in dummy bit line 60, where precharge gate 64 is activated by the same clock phase $\phi 1$ signal which activates precharge gates $12_1$–$12_N$. Since all of the source inputs of transistors $62_1$–$62_N$ are permanently grounded, the application of a precharge signal to gate 64 will cause the 5 volts appearing at the source of gate 64 to pass therethrough and precharge the entire dummy bit line. As seen by reference to FIG. 1, all of the drain terminals of transistors $62_1$–$62_N$ are coupled together and applied as a D input to a flip-flop 68. The clock phase $\phi 1$ signal is applied as the clock input to flip-flop 68. Therefore, when the entire dummy bit line 60 is completely precharged, the D input to flip-flop 68 will go high, toggling the Q output of flip-flop 68. This output signal is fed back to and applied as a third input to AND gates 28 and 30. Therefore, in accordance with the present invention neither one of the read or write operations will occur until the Q output of flip-flop 68 is toggled, since the third input to AND gates 28 and 30 will remain low, keeping both gates disabled.

The Q output signal from flip-flip 68 is also applied as a first input to an AND gate 32, where the second input to AND gate 32 is the output of NOR gate 24, which is controlled by the master clock. The output of AND gate 32 is, therefore, clock phase $\phi 2$. Clock phase $\phi 2$ is subsequently applied as an input to address decoding circuit 36 to enable the address information to be sent from address latches $34_1$–$34_N$ to the cell array itself. Therefore, in accordance with the present invention, if dummy bit line 60 is not completely precharged, due to the presence of a glitch of clock phase $\phi 1$, the Q output of flip-flop 68 will stay low, as will $\phi 2$, $\phi 2W$ and $\phi 2R$, and none of the RAM cells will be accessed.

A timing diagram illustrating the operation of the present invention is illustrated in FIG. 2. The dotted lines represent the normal operation of a RAM cycle, where the clock phase $\phi 1$ remains high long enough to fully precharge the bit lines. Once the bit lines are fully precharged, the clock phase $\phi 1$ goes low, clock phase $\phi 2$ goes high, and a read or write may be performed. As seen by reference to FIG. 2, the dummy bit line is constructed so that it will precharge at a slower rate than the remainder of the bit lines, thereby insuring that all of the bit lines are fully precharged before clock phase $\phi 2$ is initialized. The rate at which the dummy bit line is allowed to precharge is determined by its capitance and its precharge gate size, and may be chosen at the discretion of the user. Additionally, to insure proper operation, the dummy bit line should be laid out identically like the bit lines of the array, that is, geometrically very similar to the real bit lines so that its capacitance tracks as closely as possible with the real bit lines.

Returning to FIG. 2, if a glitch occurs on clock phase $\phi 1$, shown by the solid line in FIG. 2, neither the exemplary bit line nor dummy bit line is completely precharged. Therefore, clock phase $\phi 2$ will remain low, and the cell array will not be accessed.

What is claimed is:

1. A memory arrangement comprising
   an array of memory cells arranged to occupy rows and columns;
   a plurality of bit lines, each bit line associated with a separate one of the rows of said array of memory cells;
   a clock source responsive to an external master clock signal for generating as separate output signals a first clock phase and a second clock phase, said plurality of bit lines responsive to said first clock phase for precharging said plurality of bit lines to a predetermined value when said first clock phase is of a first binary value;
   a dummy bit line responsive to said first clock phase for precharging said dummy bit line wherein said dummy bit line precharges at a rate slower than said plurality of bit lines;
   latching means responsive to both said first clock phase and said dummy bit line for producing an output signal of a first binary value if and only if said first clock phase is in transition between said first binary value and the other binary value, and said dummy bit line is sufficiently precharged such that said bit lines are precharged to said predetermined value; and
   clock lockout means responsive to both said second clock phase and said latching means output signal allowing the propagation of said second clock phase to said memory array if and only if said latching means output signal is of said first binary value.

2. A memory arrangement formed in accordance with claim 1 wherein the dummy bit line comprises a similar geometry as each bit line of the memory array such that said dummy bit line exhibits a similar capacitance as each bit line of said memory array.

3. A memory arrangement formed in accordance with claim 1 wherein the latching means comprises a flip-flop circuit where the first clock phase is applied as a first input to the flip-flop and the dummy bit line output signal is applied as a second input to the flip-flop.

* * * * *